United States Patent [19]

Buchmann et al.

[11] 4,185,814

[45] Jan. 29, 1980

[54] PICK UP AND PLACEMENT HEAD FOR GREEN SHEET AND SPACER

[75] Inventors: Albert H. Buchmann, Richmond, Ky.; Thomas J. Cochran, LaGrangeville; Walter W. Ficker, Fishkill, both of N.Y.; Alfred A. Stricker; Walter von Kaenel, both of Pompano Beach, Fla.

[73] Assignee: International Business Machines Corporation, Armonk, N.Y.

[21] Appl. No.: 859,778

[22] Filed: Dec. 12, 1977

[51] Int. Cl.² .................. B65H 3/08; B65H 7/02
[52] U.S. Cl. .................... 271/108; 271/259; 294/64 R
[58] Field of Search ............. 294/64 R, 65; 214/1 BS, 214/1 BT, 8.5 D; 248/363; 271/108, 232, 258, 259; 269/21

[56] References Cited

U.S. PATENT DOCUMENTS

| | | | |
|---|---|---|---|
| 715,905 | 12/1902 | Tuck et al. | 294/64 R |
| 2,776,163 | 1/1957 | Cremer | 294/64 R |
| 3,180,608 | 4/1965 | Fischer | 269/21 UX |
| 3,523,707 | 8/1970 | Roth | 294/65 |
| 3,694,894 | 10/1972 | Jelinek et al. | 269/21 X |

FOREIGN PATENT DOCUMENTS 2440691 3/1976 Fed. Rep. of Germany ........ 294/64 R

Primary Examiner—Johnny D. Cherry
Attorney, Agent, or Firm—James M. Thomson

[57] ABSTRACT

A vacuum pick up and transfer head adapted for handling flimsy sheets of material such as spacer sheet and uncured ceramic sheet commonly referred to as green sheet. The vacuum transfer head is of generally rectangular configuration having a sheet contacting lip having vacuum slots formed through the periphery thereof to hold the sheets in place by vacuum pressure. The center of the sheet contacting face is recessed whereby, with a sheet in place and acting as a diaphragm, a central vacuum chamber is also defined. A series of check valves are provided to control application of vacuum and positive pressure to the green sheet for picking the sheet up, retaining it and stripping it. A plurality of probes are provided in the handling head, adapted to selectively project through the sheet contacting surface for detecting green sheet and/or spacer sheet utilized inbetween layers of green sheet. These probes also can act as positive strippers when the head enters a green sheet spacer tray in the process of removing a sheet of spacer or green sheet.

7 Claims, 6 Drawing Figures

PICK UP AND PLACEMENT HEAD FOR GREEN SHEET AND SPACER

BACKGROUND OF THE INVENTION

1. Related Applications

U.S. Patent Application Ser. No. 740,707 filed Nov. 11, 1976, now U.S. Pat. No. 4,068,994, entitled "Apparatus for the Printing of Ceramic Green Sheets" by R. H. Cadwallader, Y. Darves-Boronoz, A. S. Gasparri and F. Racine and assigned to International Business Machines Corporation.

U.S. Patent Application Ser. No. 859,777 filed concurrently with the present application entitled "Method and Apparatus for Locating and Aligning Flimsy Sheets" by D. E. Lonser, W. G. Rance, A. A. Stricker and W. VonKaenel and assigned to the International Business Machines Corporation.

2. Field of the Invention

The present invention relates to a vacuum pick up and transfer head for handling flimsy sheets. More particularly, the invention concerns an improved vacuum pick up and transfer head adapted for handling of thin flexible materials such as uncured ceramic green sheet. Such sheets require adequate support at a variety of locations during various stages of process manufacturing, without contact with contaminating objects such as human hands, etc.

In the manufacture of semiconductor devices, multi-layer ceramic modules are becoming more widely used. Such modules are comprised of multiple layers of ceramic materials stacked in a particular orientation, with each sheet or layer of ceramic having imprinted thereon a particular conductive pattern. With the entire stack of uncured ceramics in place the stack is pressed and cured to form an integral ceramic package having a large plurality of electrically connected conductive paths arranged therein.

Heretofore, in the manufacture of such multi-layer ceramic packages it has been the practice to handle and stack by hand sheets of uncured ceramic sheet material known as green sheet. Such green sheet is thin, flimsy material which is easily subject to stretching and other deformation, as well as tearing and degradation by contact with human hands, particularly if finger prints are left within a region to be imprinted with conductive material.

Other problems are encountered in obtaining satisfactory alignment of such green sheet and the spacer sheets which are commonly utilized in stacking the sheets within trays to prevent adhesion of sheets to each other. These problems are discussed in more detail in the aforementioned related application by D. E. Lonser et al., describing a Method and Apparatus for Locating and Aligning Flimsy Sheets. However, it should be apparent that a need exists in the art for an effective pick up transfer head for picking up flimsy sheets and transporting them between various process steps without damaging the green sheet. Moreover, a need exists for a pick up and transfer head which is capable of supporting the green sheet both on the periphery and in the center during such handling to prevent stretching and tearing of the green sheet prior to imprinting and/or placement in a final stack. It is also desirable to provide a pick up and transfer head which has a capability of detecting whether a green sheet or a spacer sheet has been picked up, and which includes means capable of positively stripping green sheets and spacer sheets from the head at a predetermined time.

SUMMARY OF THE INVENTION

Accordingly, it is an object of the invention to provide an improved pick up and transfer head for handling ceramic green sheet material and/or other flimsy sheets which will provide adequate support to the sheets during handling, without degradation or damage.

It is another object of the invention to provide, in such a pick up and transfer head, a capability for differentiating when at least two different types of flimsy sheet materials have been picked up, and to include means for selectively stripping flimsy sheets from the head.

These objects and other features of the invention are attained in a vacuum pressure operated pick up and transfer head which generally comprises a rectangular block having a sheet contacting surface or lip with vacuum slots formed along the periphery thereof to retain flimsy sheets when the surfaces are brought in contact therewith. The center section of the sheet contacting surface is recessed whereby an inner vacuum chamber is formed when the sheet contacting surface is brought into contact with a flimsy sheet so that the sheet acts as a diaphragm. A vacuum control and manifold system is provided, including a plurality of check valves, which enable the application of vacuum and/or positive pressure to selectively pick up and discharge flimsy sheets from the face of the transfer head. A plurality of probes are provided in the head, which are selectively extended through the sheet contacting surface to detect whether green sheet or spacer sheet has been picked up by the head. The probes can also be utilized as positive stripping members during discharge of green sheet or spacer sheet into a tray.

Other features and advantages of the invention are described in the following detailed description taken in conjunction with the accompanying drawings wherein.

DETAILED DESCRIPTION OF THE INVENTION

Figure 1:
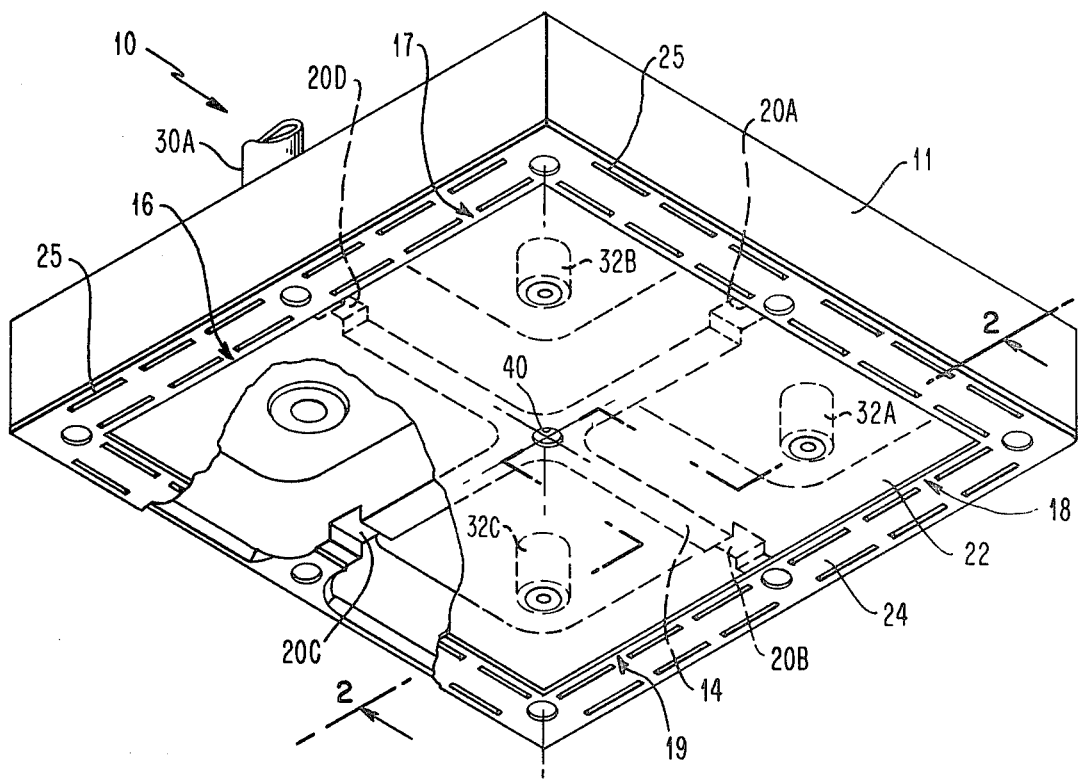
FIG. 1 is a diagrammatic view of a vacuum head designed in accordance with the invention with parts broken away.
Figure 2:
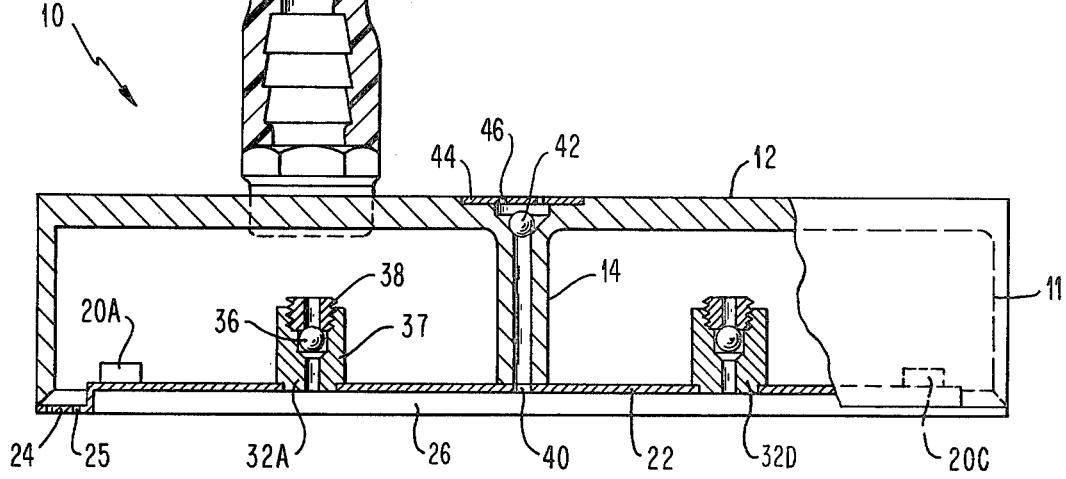
FIG. 2 is a sectional view of the vacuum head illustrated in FIG. 1.
Figure 3:
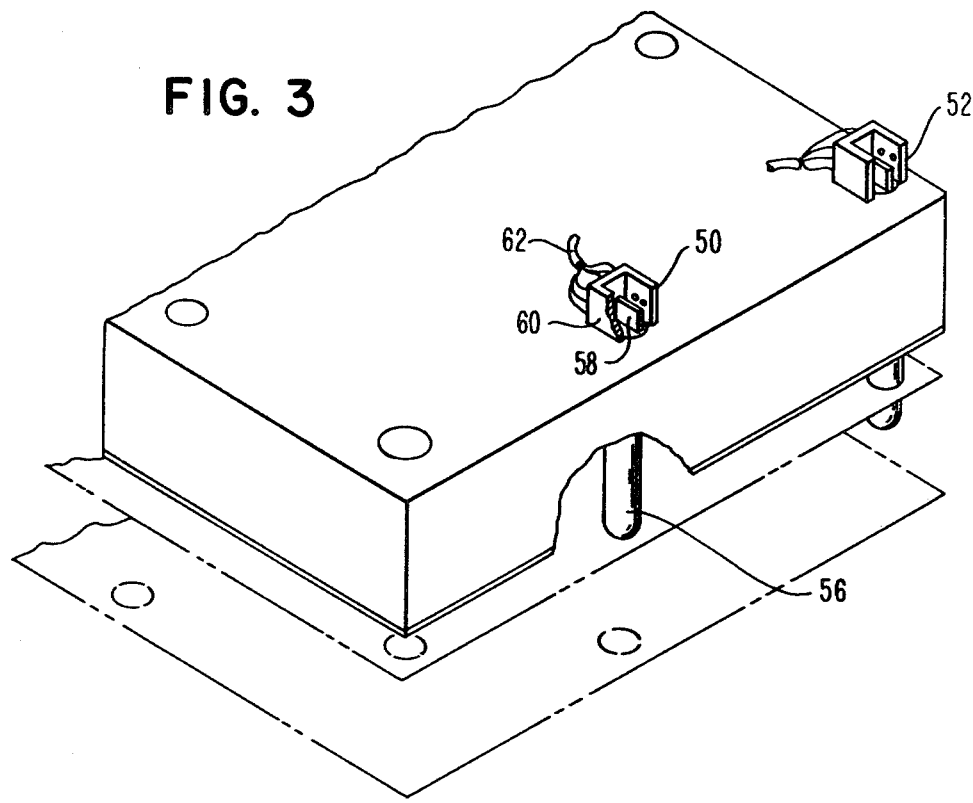
FIG. 3 is a partial isometric view with parts broken away of a portion of the vacuum head illustrated in FIG. 1.

Referring now to the drawings and particularly to FIGS. 1–3, a vacuum pick up and transfer head 10 is illustrated. The head includes sides 11 and a back member 12 of generally rectangular configuration having a support cross member 14 formed internally thereof to define a vacuum chamber comprising four regions 16–19 interconnected by slots 20A–D formed through cross member 14. The vacuum chamber is bounded on the sheet or front side by a layer 22 of suitable material which is slightly recessed with respect to a sheet contacting lip 24 defined about the periphery of sides 11.

A plurality of slots 25 are formed through lip 24 extending into the vacuum chambers whereby vacuum or air pressure can be applied to the edges of a rectangular sheet brought into contact with the periphery of the transfer head. With such a sheet in place the sheet acts as a diaphragm so that a region 26 defined between layer 22 and the sheet becomes a vacuum chamber which exerts force upon the center of the sheet and retains it in a supportive condition when the head is moved.

To properly distribute vacuum or air pressure to achieve this result, vacuum air fittings such as 30A are provided, each extending through back member 12 into a corresponding vacuum chamber. The fittings communicate with a controlled source of air pressure of conventional design, not illustrated. In corresponding fashion check valves 32A-D are also provided, each one defining an air channel between the main vacuum chamber and chamber 26.

Each check valve includes a ball 36 retained between a housing 37 having an air passageway formed therein, and a removable fitting 38, also having an air passageway formed therethrough. A spring washer 47 is used to close off the air passageway in all conditions except when the main chamber is pressurized.

Figure 5A:
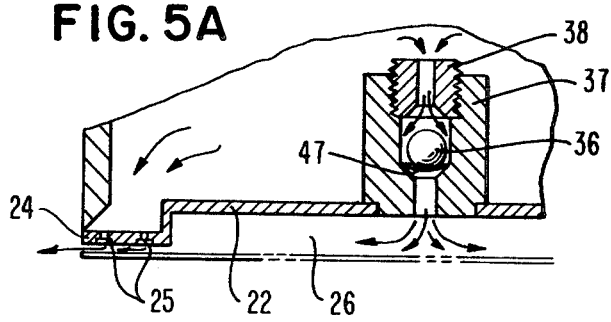
FIGS. 5A and 5B are schematic representations of the check valves illustrated in FIG. 2 under different pressure conditions.
Figure 5B:
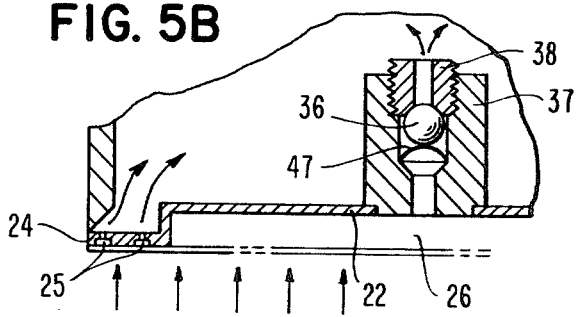

The position of the ball in the check valve, with positive pressure on is illustrated in FIG. 5A where it is apparent that positive air pressure is permitted to flow from the main chamber into chamber 26. The positon of the ball with vacuum pressure applied to the main chamber is illustrated in FIG. 5B where it is apparent that the vacuum pressure and spring washer cause the ball to be lifted against fitting 38. This forms a seal which, in turn, creates a vacuum pressure level of predetermined magnitude in chamber 26 as a result of the green sheet acting as a diaphragm utilizing its own weight.

A venting channel 40 is provided between the back of member 12 and chamber 26 through the center of cross member 14, as illustrated. A pressure relief ball 42 is secured in an annular recess at the upper end of channel 40 and retained there by a plate 44 having venting holes 46 formed therein. With check valves 32A-D in a closed position thereby creating slight vacuum pressure in chamber 26, pressure relief ball 42 is retained against the mouth of channel 40 thereby closing the venting channel. With positive pressure applied in chamber 26 the pressure relief ball is moved away from the mouth of channel 40 whereby positive pressure is vented through holes 46.

FIG. 3 illustrates a green sheet sensor pin 50 and a spacer sheet sensor pin 52 which are typical of a plurality of such sensors reciprocally located in suitable openings extending through the periphery of sheet contacting lip 24. As shown, each of the sensors includes a bullet-nosed member 56 adapted to extend below the surface of lip 24 into contact with a sheet engaged by that surface.

With member 56 in an upper position, caused by contact with a sheet, an upper portion 58 of the probe acts in conjunction with a magnetic yoke 60 to form an electromagnetic circuit sensed by appropriate sensing means connected with conductors 62. Accordingly, the sensor provides an electrical indication of the presence of a sheet by the pin position in either an extended or a withdrawn position.

In order to differentiate between green sheet or spacer sheet it is only necessary to provide green sheets with holes located in predetermined positions and spacer sheets with holes in other predetermined positions which correspond to the positions of the various sensor pins. It has been found that green sheet and spacer sheet can be identified with one sensor each; however, in the preferred embodiment a plurality of spacer sheet sensor pins are provided located at least in the four corners of the head, and a plurality of green sheet sensors are provided located between the corners.

Figure 4:
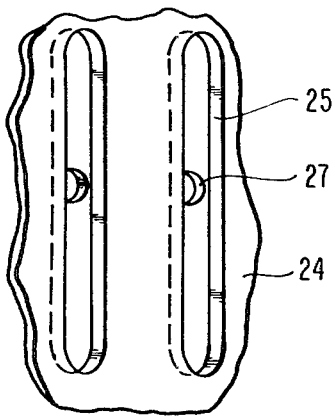
FIG. 4 is a diagrammatic view illustrating details of the vacuum slots provided in the head illustrated in FIG. 1.

FIG. 4 illustrates a typical detail of the slots oriented around the periphery of the head. As shown, each slot is an elongate relatively narrow recess formed within surface 24 having a tiny hole 27 communicating between the center of the slot and the vacuum chamber. The hole size and slot lip are selected to provide a predetermined amount of lifting force to the flimsy sheets, depending upon the size of sheet which are to be handled and depending upon the vacuum air pressure levels which are available. However, in the preferred embodiment these slots are in the order of three hundredths of an inch wide and 10-20 times that in length.

In operation the transfer head is placed over a tray containing green sheet or spacer sheet and lowered into contact with the uppermost sheet in the tray. Vacuum pressure is then switched on whereby the outer surface of the rectangular green sheet is adhered to surface 24 and the interior region of the green sheet is suspended and supported by vacuum pressure exerted by chamber 26. The head is then elevated so that the green sheet can be transferred to another location for deposit. The sensor pins detect whether a green sheet or a spacer sheet has been picked up and verify the orientation of the sheet with respect to the head.

Upon deposition of the sheet the head design described permits use of positive pressure to deposit the sheet via positive force into a tray, if desired. The stripping function can be facilitated by providing means for lowering the sensor pins, if desired. In addition, the head described can be utilized in handling the green sheet in the manner described in the aforementioned related application, wherein a balanced pressure zone is created between a transfer head and an alignment head whereby the green sheet is suspended until alignment pins can be inserted through the alignment holes in the corner thereof. The arrangement of check valves and pressure relief valve facilitate the switching from positive pressure to vacuum pressure and vice versa. Moreover, the head design utilizing what is in effect a recessed center section, wherein the green sheet acts as a diaphragm, to provide self supporting force to the center of the green sheet without damage or distortion to this region of the sheet is a significant improvement in handling procedure.

We claim:

1. A transfer head for pick up and placement of flimsy sheets of flexible material including
    a back member having a vacuum chamber formed therein, a sheet contacting lip, adapted to communicate with the vacuum chamber, to contact and retain the outer periphery of a flimsy sheet by vacuum pressure, and a non sheet contacting inner region defined within said sheet contacting lip which cooperates with the sheet when the latter is in contact with said lip to produce a vacuum pressure region that serves to support the flimsy center portion of the sheet without contact by said transfer head, and sensing means associated with said head for detecting which of at least two types of flimsy sheets has been picked up by said transfer head.

2. The transfer head of claim 1 wherein the sensing means include a plurality of locator pins reciprocally mounted through the sheet contacting lip, adapted to fit through corresponding locator openings formed within certain types of sheets and to contact the edges of other types of sheets.

3. The transfer head of claim 2 wherein said locator pins include a magnetic yoke adapted to produce electrical signals indicating the state of the pin in an extended or a withdrawn position with respect to said lip.

4. A transfer head for pick up and placement of flimsy sheets of flexible material including a rectangular shaped back member having sides extending from the periphery thereof adapted to form a central vacuum chamber therein, a sheet contacting lip secured to the sides having slots therein adapted to communicate with the vacuum chamber whereby the lip is capable of retaining the outer periphery of a flimsy sheet by vacuum pressure when brought into contact therewith, a layer of material extending across the face of said head counter sunk with respect to the sheet contacting lip so as to define a non sheet contacting inner region on the face of the transfer head which cooperates with a sheet when the latter is in contact with said lip to produce a vacuum pressure region that acts to support the flimsy center portion of a sheet without contact by said transfer head, and sensing means associated with the head for detecting which of at least two types of flimsy sheets has been picked up by said transfer head.

5. The transfer head of claim 4 wherein valve means are provided to regulate flow of vacuum and positive pressure between the vacuum chamber in said head and the vacuum region established between said face layer and said sheet.

6. The transfer head of claim 5 wherein a vent is provided through said head between the vacuum pressure region adjacent the flimsy sheet and the open atmosphere behind the head.

7. The transfer head of claim 6 wherein said vent is selectively closed by a floating ball valve.

* * * * *